(12) United States Patent
Kuenemund et al.

(10) Patent No.: US 9,337,156 B2
(45) Date of Patent: May 10, 2016

(54) METHOD FOR MANUFACTURING A DIGITAL CIRCUIT AND DIGITAL CIRCUIT

(71) Applicant: Infineon Technologies AG, Neubiberg (DE)

(72) Inventors: Thomas Kuenemund, Munich (DE); Berndt Gammel, Markt Schwaben (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/248,375

(22) Filed: Apr. 9, 2014

(65) Prior Publication Data

US 2015/0294943 A1 Oct. 15, 2015

(51) Int. Cl.
| | | |
|---|---|---|
| *H01L 27/092* | (2006.01) | |
| *H01L 27/085* | (2006.01) | |
| *H01L 23/00* | (2006.01) | |
| *H01L 21/8234* | (2006.01) | |
| *H03K 19/0185* | (2006.01) | |
| *H01L 27/112* | (2006.01) | |
| *G06F 21/75* | (2013.01) | |

(52) U.S. Cl.
CPC .............. *H01L 23/576* (2013.01); *G06F 21/75* (2013.01); *H01L 21/823412* (2013.01); *H01L 21/823462* (2013.01); *H01L 21/823475* (2013.01); *H01L 27/112* (2013.01); *H03K 19/018557* (2013.01)

(58) Field of Classification Search
CPC ....... G06F 21/76; G06F 21/75; G06F 21/558; G06F 2221/2123; H03K 19/17768; G11C 16/22; G11C 11/412; G11C 7/24; G11C 13/0059; G01R 31/31719; H01L 9/0612; H01L 25/00; H01L 27/085; H01L 27/092; H01L 27/11803; G06K 19/07363
See application file for complete search history.

(56) References Cited

U.S. PATENT DOCUMENTS

| | | | | |
|---|---|---|---|---|
| 3,849,673 A | * | 11/1974 | Koo | ................................ 327/57 |
| 5,159,260 A | * | 10/1992 | Yoh | ....................... G11C 5/143 |
| | | | | 257/E27.06 |
| 6,005,797 A | | 12/1999 | Porter et al. | |
| 7,249,109 B1 | * | 7/2007 | Silverbrook et al. | ........... 705/67 |
| 7,916,517 B2 | * | 3/2011 | Kuenemund | .................. 365/154 |
| 8,434,046 B2 | * | 4/2013 | Marinet | ........................ 716/119 |
| 9,070,439 B2 | * | 6/2015 | Gammel et al. | |
| 2004/0150052 A1 | * | 8/2004 | Riccardi et al. | ............... 257/369 |

OTHER PUBLICATIONS

J. Rajandran et al., "Security Analysis of Integrated Circuit Camouflaging", CC'13, Nov. 4-8, 2013, Berlin, Germany; pp. 709-720.
R. Torrance, "The state-of-the-art in Semiconductor Reverse Engineering at Chipworks", Sep. 9, 2009; 72 pages.
"Circuit Camouflage Technology", Syphermedia Library, Version 1.9.8j, Mar. 2012; 6 pages.

* cited by examiner

*Primary Examiner* — Vibol Tan

(57) ABSTRACT

A method for manufacturing a digital circuit is described comprising forming two field effect transistors, connecting the field effect transistors such that an output signal of the digital circuit in response to a predetermined input signal has an undefined logic state when the threshold voltages of the field effect transistors are equal and setting the threshold voltages of at least one of the field effect transistors such that the output signal of the digital circuit in response to the predetermined input signal has a predetermined defined logic state.

12 Claims, 16 Drawing Sheets

METHOD FOR MANUFACTURING A DIGITAL CIRCUIT AND DIGITAL CIRCUIT

TECHNICAL FIELD

The present disclosure relates to a method for manufacturing a digital circuit and a digital circuit.

BACKGROUND

Reverse Engineering (RE) of integrated circuits (ICs) can be considered as one of the most serious threats to semiconductor industry, since it may be misused by an attacker to steal and/or pirate a circuit design. An attacker who successfully reverse engineers an integrated circuit can fabricate and sell a similar, i.e. cloned circuit, and illegally sell, and reveal the design.

Therefore concepts and techniques that thwart reverse engineering of integrated circuits are desirable.

SUMMARY

A method for manufacturing a digital circuit is provided including forming two field effect transistors, connecting the field effect transistors such that an output signal of the digital circuit in response to a predetermined input signal has an undefined logic state when the threshold voltages of the field effect transistors are equal and setting the threshold voltages of at least one of the field effect transistors such that the output signal of the digital circuit in response to the predetermined input signal has a predetermined defined logic state.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Reverse engineering can be hindered by deploying camouflage circuits. However, these typically require process technology extensions like doping profile modifications, faked contacts or vias and/or entail significantly increased area and energy consumption. Thus, these measures are often too expensive for mass products.

In the following a method for manufacturing a circuit is described which efficiently allows increasing the necessary effort for a successful reverse engineering of a circuit, e.g. on a chip.

Figure 1:
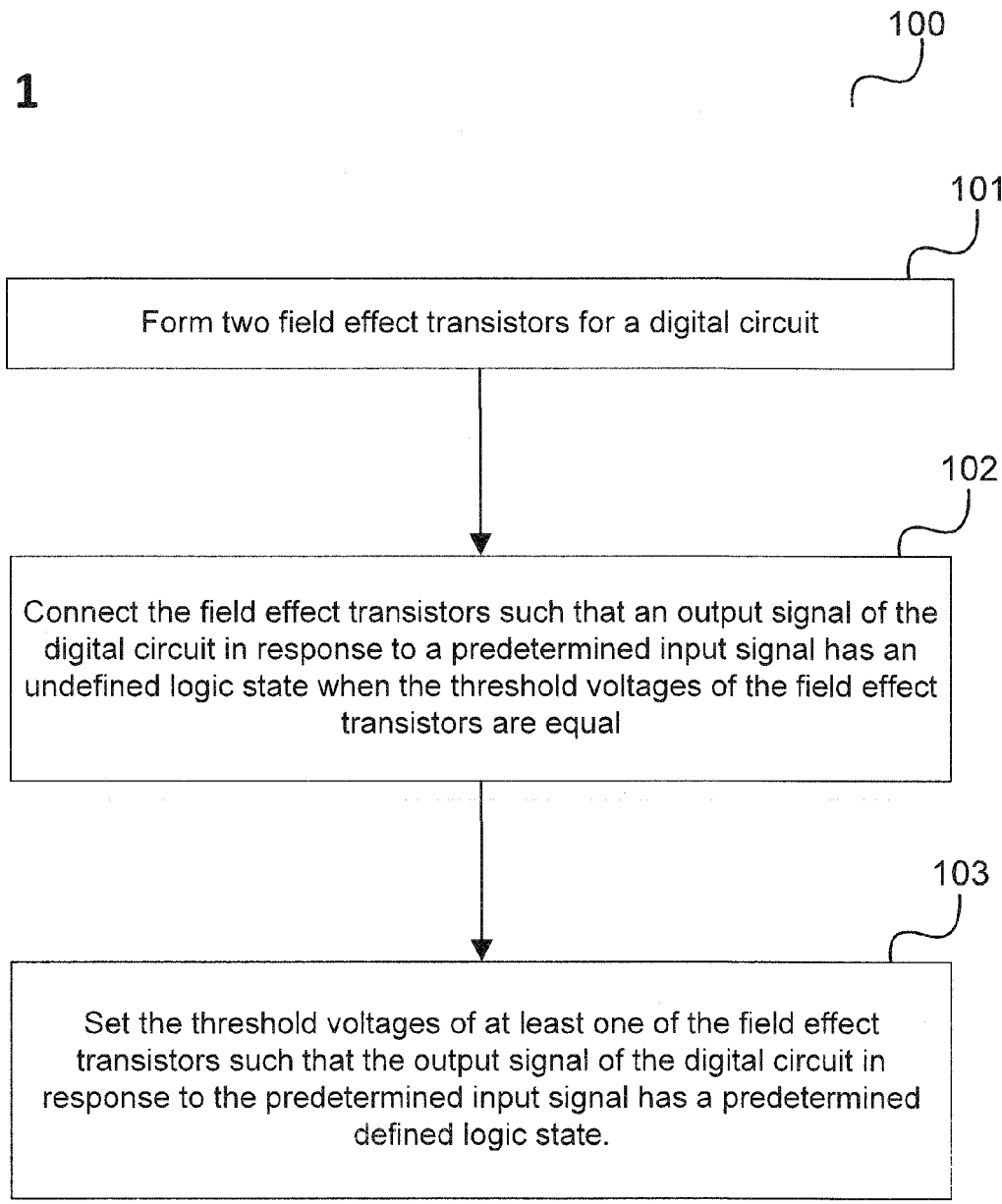
FIG. 1 shows a flow diagram.

FIG. 1 shows a flow diagram 100.

The flow diagram 100 illustrates a method for manufacturing a digital circuit.

In 101, two field effect transistors are formed.

In 102, the field effect transistors are connected such that an output signal of the digital circuit in response to a predetermined input signal has an undefined logic state (and for example a physically metastable state) when the threshold voltages of the field effect transistors are equal.

In 103, the threshold voltages of at least one of the field effect transistors is set such that the output signal of the digital circuit in response to the predetermined input signal has a predetermined defined logic state.

In other words, according to one embodiment, a metastable state of a circuit is shifted to a predefined stable state by setting the threshold voltages of two transistors of the circuit accordingly. The threshold voltage may for example be set by a certain doping of a region (e.g. a channel region) of the field effect transistor. For example, the two field effect transistors may be differently doped.

The method may further include forming an output for a signal representing the logic state of the digital circuit.

According to one embodiment, the method includes forming a further circuit component and a connection for supplying the signal to the further circuit component.

For example, the further circuit component is a logic gate.

The further circuit component may be a flip-flop.

According to one embodiment, the two field effect transistors are both n channel field effect transistors or the two field effect transistors are both p channel field effect transistors.

The field effect transistors are for example MOSFETs.

According to one embodiment, the method includes forming two competing paths, wherein one of the competing paths includes one of the field effect transistors and the other competing path includes the other of the field effect transistors.

For example, the method includes forming the competing paths such that the logic state depends on the result of the competition of the two competing paths.

The method may further include forming each of the competing paths to include a plurality of field effect transistors, and setting the threshold voltages of the field effect transistors such that the output signal of the digital circuit in response to the predetermined input signal has the predetermined defined logic state.

According to one embodiment, the method includes forming the plurality of field effect transistors in CMOS technology.

The predetermined defined logic state is for example a logic 0 or a logic 1.

According to one embodiment, the digital circuit is a flip-flop, for example an RS-flip-flop.

According to one embodiment, the field effect transistors substantially have the same dimensions.

Figure 2:
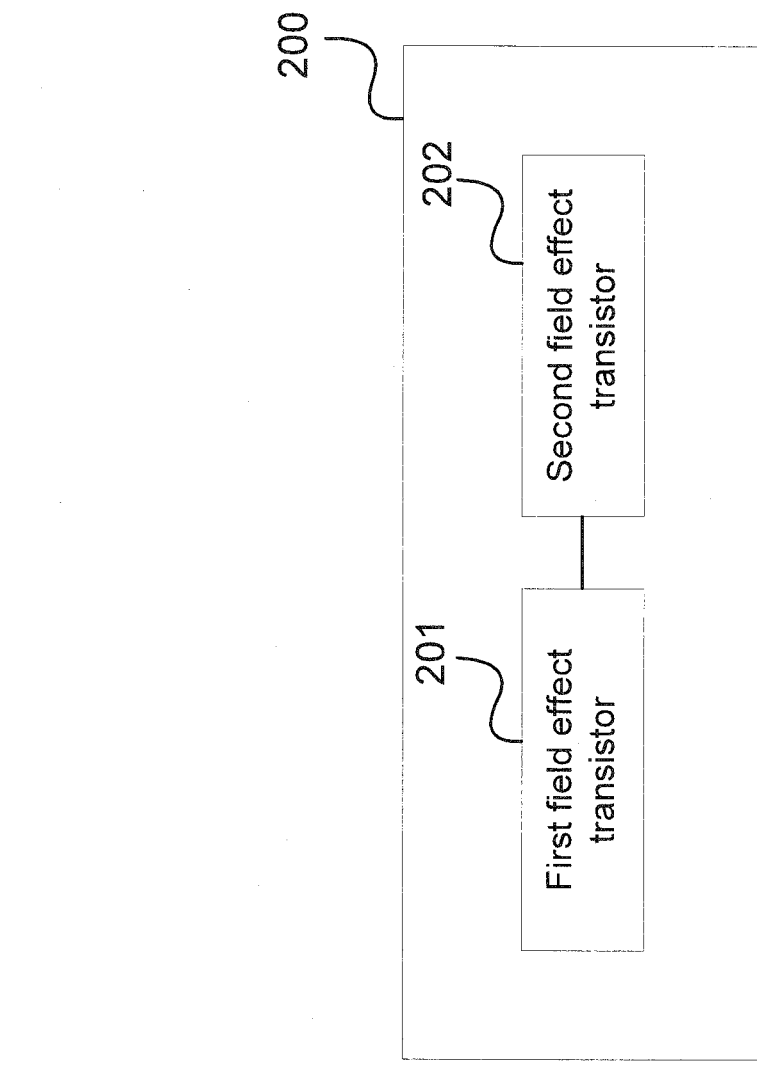
FIG. 2 shows a digital circuit.

An example of a circuit manufactured according to the method illustrated in FIG. 1 is illustrated in FIG. 2.

FIG. 2 shows a digital circuit 200.

The digital circuit 200 includes two field effect transistors 201, 202 connected such that an output signal of the digital circuit in response to a predetermined input signal has an undefined logic state when the threshold voltages of the field effect transistors are equal.

The threshold voltages of the field effect transistors differ by at least 10 mV such that the output signal of the digital circuit in response to the predetermined input signal has a predetermined defined logic state.

According to various embodiment, the threshold voltages of the field effect transistors differ by at least 20 mV by at least 30 mV or by at least 50 mV.

It should be noted that embodiments described in context with the method described with reference to FIG. 1 are analogously valid for the digital circuit 200 and vice versa.

In the following, embodiments are described in more detail.

According to one embodiment, a digital circuit is provided which is referred to as Indistinguishable yet Complementary Bit Cell (ICBC). It can be provided as one of two types, ICBC-1 and ICBC-0, generally abbreviated by ICBC-X. The ICBC-X is a gate that responds to an appropriate challenge (i.e. a predetermined input) by outputting a robust logical 1 (ICBC-1) or a robust logical 0 (ICBC-0), respectively, but cannot be distinguished by typical means of Reverse Engineering (RE) and other typical analysis methods of, i.e. attacks to, chip card controllers and security ICs.

The ICBC-X can be implemented with a physical design that is (sufficiently) symmetric in terms of its layout, i.e. its active regions, poly-silicon gates, contacts, metal connectivity etc. However, the ICBC-Xs has nMOS (n channel metal oxide semiconductor) and pMOS (p channel metal oxide semiconductor) components (generally field effect transistors) which have appropriately different threshold voltages (Vth) resulting in the robust transfer characteristics of the ICBC-X when challenged with an input pattern that would otherwise (i.e. in case of similar threshold voltages) correspond to a metastable state of the ICBC-X, i.e. a state in which the ICBC-X has no defined logic state.

Since in a typical manufacturing process, e.g. in a mixed-Vth scenario for a security IC, options for different threshold voltages such as "regular Vth" and "high Vth" are available, these can be used to realize the ICBC-X without a process change.

ICBC-1 and ICBC-0 are for example static CMOS (Complementary Metal Oxide Semiconductor) gates that can be implemented as elements of standard cell libraries.

The ICBC-X can for example be used as dynamical TIE-1 or TIE-0 cells, i.e. a TIE cell that can be switched between logically valid and invalid states, representing e.g. bits of a secret key or other pieces of confidential information.

Moreover, the ICBC-X can be combined with one or more logic gates to achieve reverse engineering resistant data paths and the ICBC-X can be concatenated to realize dynamical TIE tree structures.

The ICBC-X may further be applied to session key generation as well as address-dependent memory encryption configuration. In addition to that, after roll-out, i.e. after an ICBC-X's initial (e.g. random) configuration, the selected configuration can then be stored in a non-volatile memory for subsequent use. This may even allow for robust and reverse engineering resistant chip-individual pieces of information.

Since a multitude of ICBC-Xs can be distributed (e.g. irregularly) across an IC's entire semi-custom portion, and because these instances can be accessed in irregular, even random, temporal order, ICBC-Xs allow to tremendously increases the difficulty, risk and effort for all relevant security IC attack scenarios like reverse engineering, photon emission, laser voltage probing, etc.

The ICBC-X further provides dynamical, even chip individual characteristics in contrast to static camouflage techniques.

The ICBC-X concept can be seen to be based on resolving metastable states or metastable state transitions of (bistable) feedback circuitry by deploying (MOS) field effect transistors (in general switches) with different threshold voltages (in general state transition characteristics) in order to achieve robust ICBC-X state transitions, whereupon the nature of any given ICBC-X instance (X=1 or 0) remains concealed for an attacker employing relevant security IC attack scenarios like reverse engineering, photon emission, laser voltage probing, etc.

Figure 3:
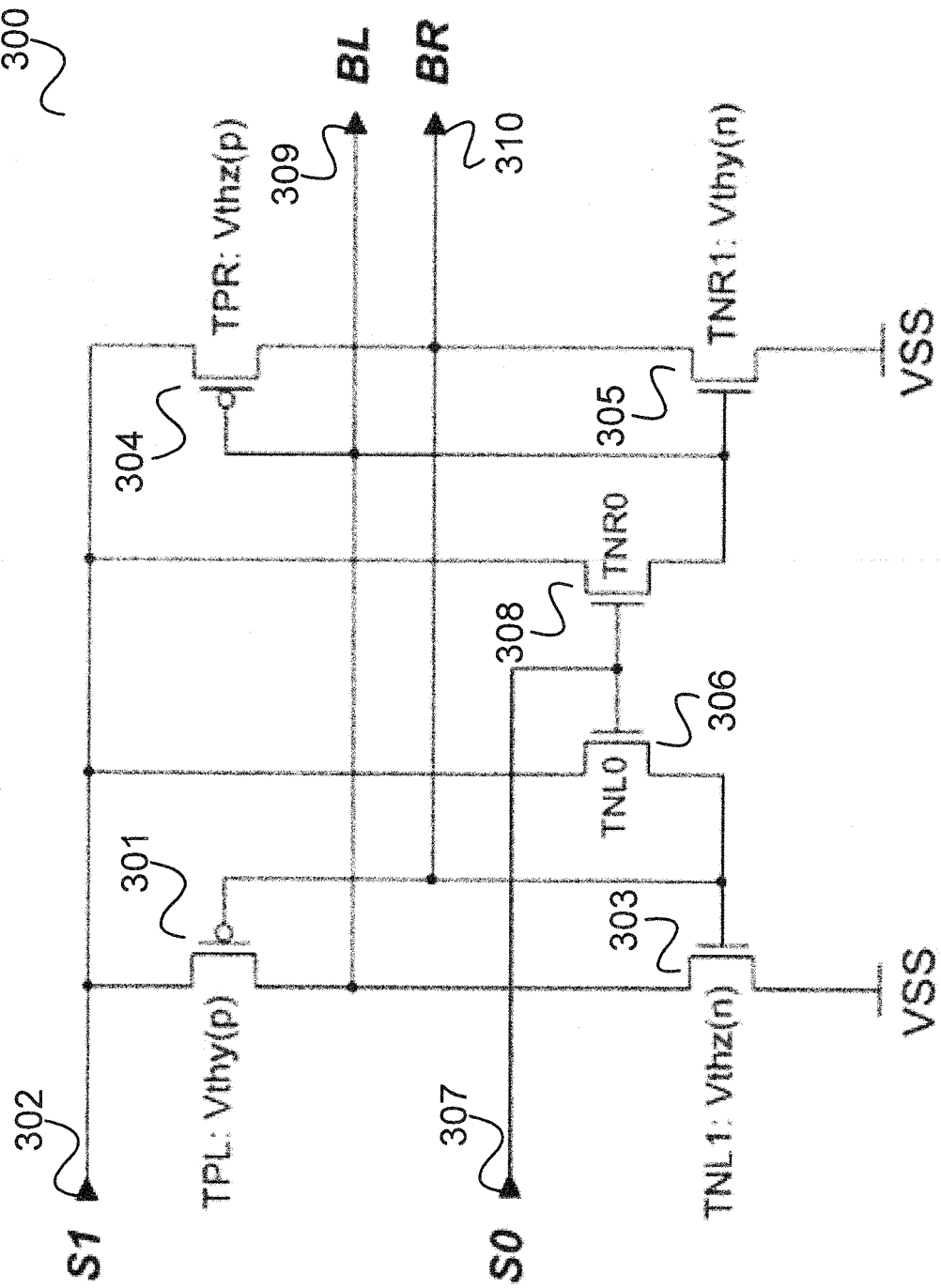
FIG. 3 shows an ICBC-X according to an embodiment.

An example for the circuitry schematic of an ICBC-X (X=0,1) is illustrated in FIG. 3.

FIG. 3 shows an ICBC-X 300 according to an embodiment.

The ICBC-X 300 includes a first p channel FET (field effect transistor) 301 whose source terminal is connected to a first input terminal 302 receiving an input signal S1, whose drain is connected to the drain terminal of a first n channel FET 303 and whose gate is connected to the gate of the first n channel FET 303. The source of the first n channel FET 303 is coupled to a low supply potential (VSS).

The ICBC-X 300 further includes a second p channel FET 304 whose source terminal is connected to the first input terminal 302, whose drain is connected to the drain terminal of a second n channel FET 305 and whose gate is connected to the gate of the second n channel FET 305. The source of the second n channel FET 305 is coupled to the low supply potential (VSS).

The gate of the first n channel FET 303 is further coupled to the source of a third n channel FET 306 whose drain is connected to the first input terminal 302 and whose gate is connected to a second input terminal 307 receiving an input signal S0.

The gate of the second n channel FET 305 is further coupled to the source of a fourth n channel FET 308 whose drain is connected to the first input terminal 302 and whose gate is connected to the second input terminal 307.

Further, the drain of the first p channel FET 301 is connected to the gate of the second p channel FET 304. This connection is further connected to a first output terminal 309 outputting an output signal BL.

Similarly, the drain of the second p channel FET 304 is connected to the gate of the first p channel FET 301 and this connection is further connected to a second output terminal 310 outputting an output signal BR.

Illustratively, the ICBC-X 300 has an internal feedback loop that is composed of the p channel FETs (e.g. pMOS transistors) 301, 304 and the first n channel FET 303 and the second n channel FET 305 (e.g. nMOS transistors) and which is enabled for S1=1 and disabled for S1=0, as well as pre-charge devices in the form of the third n channel FET 306 and the fourth n channel FET 308 (e.g. nMOS transistors) that are enabled for S0=1 and disabled for S0=0.

According to one embodiment, the ICBC-X's physical design is sufficiently (i.e. not necessarily perfectly) symmetric in terms of the ICBC-X layout, i.e. its device dimensions (gate widths and lengths) active regions, poly gates, contacts, metal connectivity etc. are symmetric in order to ensure proper and robust ICBC-X transfer characteristics, and to make sure that even from closest possible layout inspection there is no way to draw any conclusion as to the identity (ICBC-1 or ICBC-0) of the ICBC-X.

For example, the ICBC-X 300 has at least symmetric nMOS and pMOS gate dimensions, i.e. the first p channel transistor 301 and the second p channel transistor 304 have the same gate dimension, the first n channel transistor 303 and the second n channel transistor 305 have the same gate dimension and the third n channel transistor 306 and the fourth n channel transistor 308 have the same gate dimension.

The ICBC-X is provided with a camouflage property by
  the first p channel transistor 301 and the second p channel transistor 304 having different threshold voltages Vthy(p) and Vthz(p) and
  (optionally) the first n channel transistor 303 and the second n channel transistor 305 having different threshold voltages Vthz(n) and Vthy(n).

For instance, the threshold voltages Vthz and Vthy correspond to high-Vth and regular-Vth CMOS process options, respectively.

The difference in threshold voltage results in a robust transfer characteristics of the ICBC-X when challenged with an input pattern that would otherwise (i.e. in case of equal threshold voltages) correspond to a metastable state, e.g. a state in which the circuit's logic state is an undefined logic state (since its actual physical state cannot be predetermined, and e.g. depends on unknown process fluctuations or noise etc.).

For the following considerations the logical value 0 means the lower supply voltage VSS and the logical 1 means the higher supply voltage VDD.

ICBC-X is an ICBC-1 when
{Vthz(p)>Vthy(p)} AND {Vthz(n)≥Vthy(n)}.
It can assume two stable states:
  in PRECHARGE state (S1=0, S0=1), the output signals BL, BR are logically not valid (yet physically well defined and the same as for ICBC-0, namely (BL, BR)=(0, 0)), whereas
  in VALID state (S1=1, S0=0) the output is always at logic 1, i.e. defined to be (BL, BR)=(1,0).
ICBC-X is an ICBC-0 when
{Vthz(p)<Vthy(p)} AND {Vthz(n)≤Vthy(n)}.
It can assume two stable states:
  in PRECHARGE State (S1=0, S0=1), the output is logically not valid (yet physically well defined and the same as for ICBC-1, namely (BL, BR)=(0, 0)), whereas
  in VALID State (S1=1, S0=0) the output is always at logic 0, i.e. defined to be (BL, BR)=(0,1) for the above example.

Possibilities to set the threshold voltage of a field effect transistor are described in the following with reference to FIG. 4.

Figure 4:
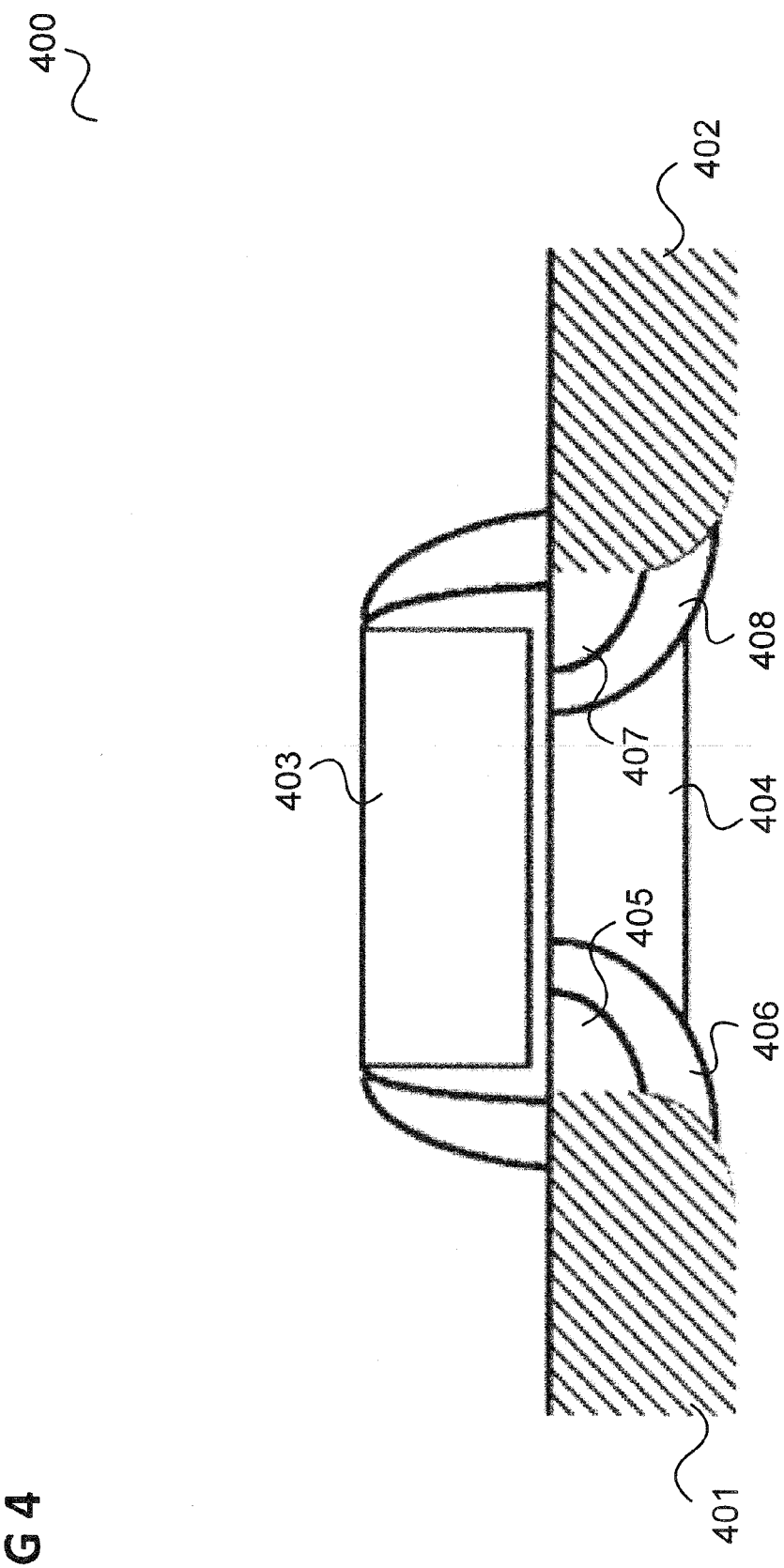
FIG. 4 shows a field effect transistor (FET).

FIG. 4 shows a field effect transistor (FET) 400.

The FET 400 includes a source region 401, a drain region 402, a gate 403 and a channel region 404. The channel region 404 may lie in a substrate or in a well within the substrate.

The source region 401 has an extension 405 and a halo 406. Similarly, the drain region 402 has an extension 407 and a halo 408.

The threshold voltage of the FET 400 can be set by setting appropriate doping concentrations in the channel region 404, of the halos 406, 408 and/or setting the doping concentration in the extensions 405, 407.

The asset of any camouflage technology is to hide information in physical structures which are not visible in a typical reverse engineering process. Known advanced camouflage cell designs use, e.g., modification of transistor drain or channel implants to directly alter the function. Such camouflage designs necessitate the construction of special transistor devices and corresponding non-standard cells. This can be an expensive process and a source for additional reliability risks, especially if production should be done in a foundry. Such designs usually include a set of identically looking supercells consisting of a large number of transistors. These cells have different logic functions, where the modified transistors determine the diverse logic function. Such cells can typically be easily identified among regular standard cells, which are optimized for minimum transistor count. The camouflage protection consists in the difficulty of finding out the logic function of a large number of cells embedded in the chip. Basically a successful cloning attack requires multiple probing to obtain the truth tables of all of these cells.

In contrast, protection against reverse engineering based on ICBC-Xs can be seen to be solely based on standard devices which are typically available, e.g. in a mixed-Vth design. The ICBC-X can be seen to use hidden information. It is not possible to identify the VALID State of the ICBC-X by means of typical reverse engineering, i.e. ICBC-1 and ICBC-0 instances are indistinguishable with respect to typical reverse engineering methods. Revealing the hidden information for example requires forcing the input signals and probing the output signals of the ICBC-X.

In the ICBC-X the hidden information is a single Boolean value that can for example be used to change the logic function of subsequent combinatorial logic. For example, embodiments may A. Use the hidden Boolean variable of one or more ICBC-X cells directly as input to a combinatorial logic network; and/or
  B. Embed an ICBC-X structure in a larger super-cell which realizes a more complex (n,m)-Boolean function F(x) (i.e. an n input, m output Boolean function).

Approach A may for example be used to hide a secret binary vector (e.g. used as a key or a configuration). The secret vector is for example chosen large enough to thwart a probing attack. The attack effort should at least increase linearly with the number of hidden bits. Care is for example taken that there is no circuit which allows reading out several bits of the secret vector sequentially (e.g. via shift register chains). It can be expected that the success probability for an attacker drops super-linearly, because almost each probing point usually requires a FIB (focused ion beam) modification. Hence the success probabilities for a single FIB modification are multiplied. In this case the success probability for the attacker would drop exponentially with the number of bits.

With approach B unidentifiable (at least by typical reverse engineering) logical functions can be realized. Moreover, cells may be constructed which have identical layout but provide different logic functions.

Figure 5:
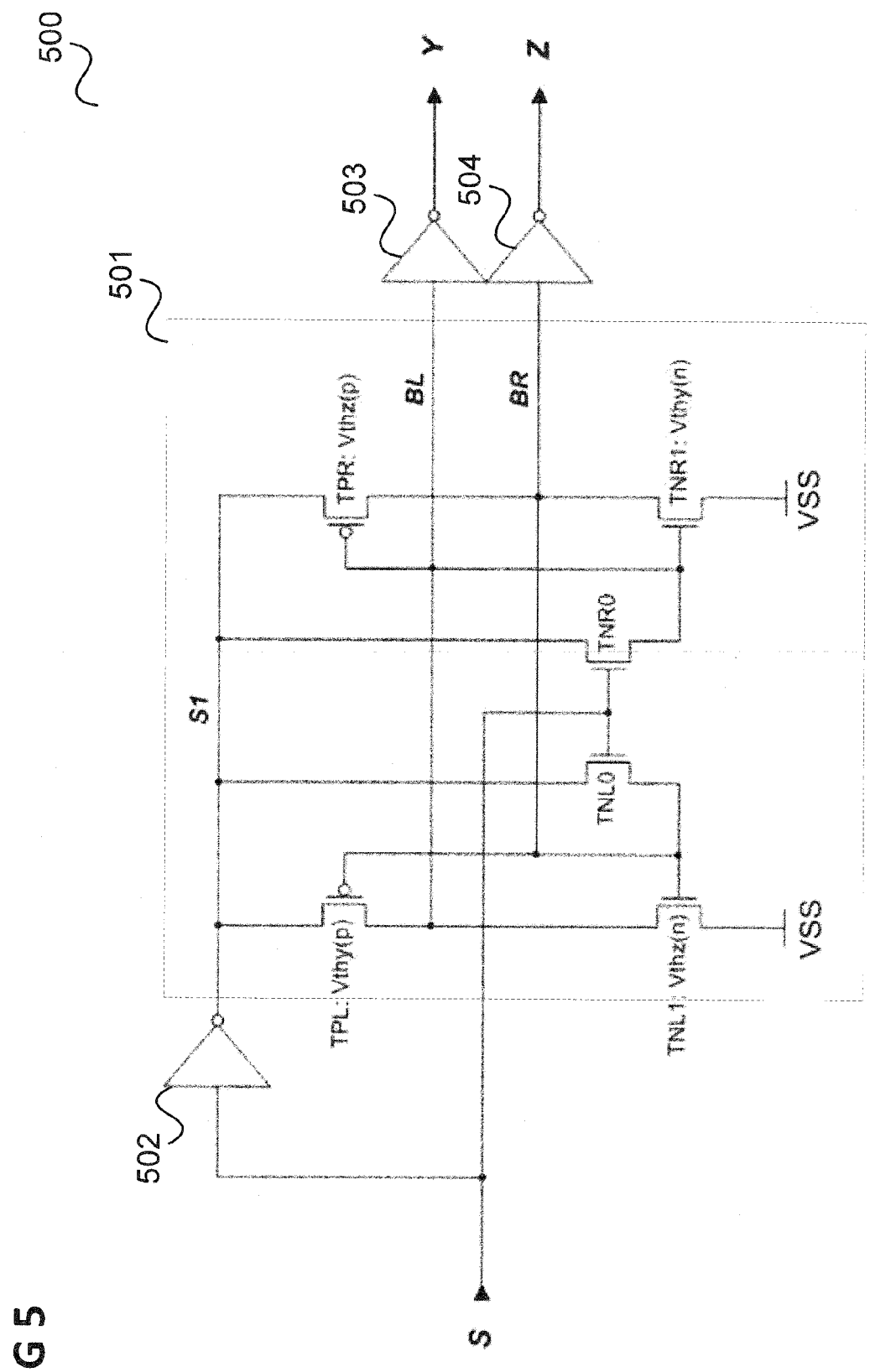
FIG. 5 shows an example of an ICBC-X standard cell.

FIG. 5 shows an example of an ICBC-X standard cell 500.

The ICBC-X standard cell 500 includes an ICBC-X 501 as described above with reference to FIG. 3, wherein the input signal S1 is an input signal S inverted by a first inverter 502, the input signal S0 is the input signal S, a first output signal Y is the output signal BL inverted by a second inverter 503 and a second output signal Z is the output signal BR inverted by a third inverter 504. Illustratively, the input signal S1 and the output signals BL and BR are buffered in order for the ICBC-X to be independent of input slope of S1 and output loads at BL and BR.

For the ICBC-1 case, i.e. for Vthz(p)>Vthy(p), Vthz(n)>Vthy(n), the cell 500 (in this case an ICBC-1 cell) realizes the Boolean equations $$Y=\overline{S},$$

$$Z=1,$$

whereas for the ICBC-0 case, i.e. for Vthz(p)<Vthy(p), Vthz(n)<Vthy(n), $$Y=1,$$

$$Z=\overline{S}.$$

Thus, for the general ICBC-X case $$Y=X\cdot\overline{S}+\overline{X}=\overline{S}+\overline{X},$$

$$Z=\overline{X}\cdot\overline{S}+X=\overline{S}+\overline{X}.$$

Figure 6:
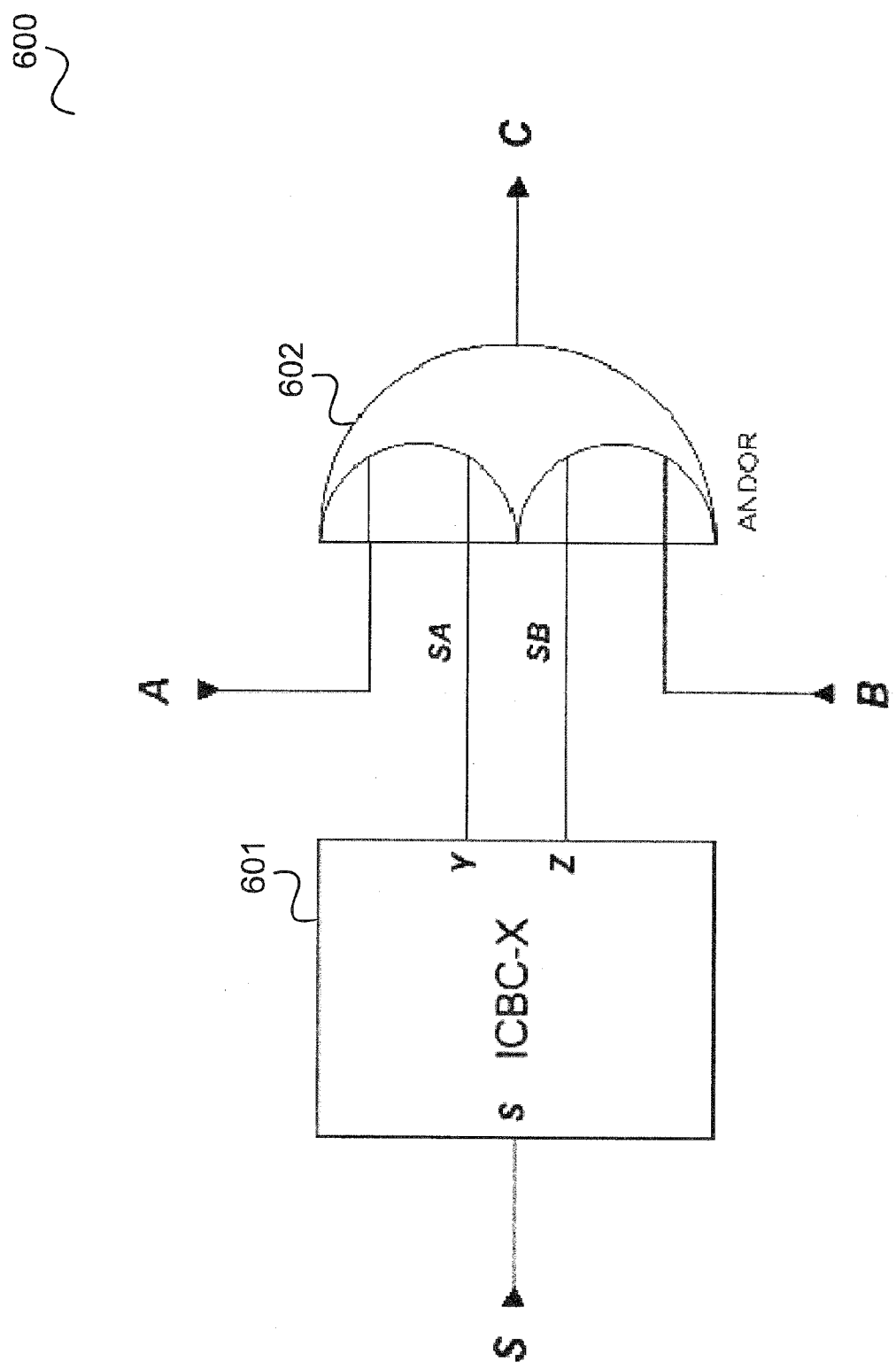
FIG. 6 shows an ICBC-X multiplexer according to an embodiment.

FIG. 6 shows an ICBC-X multiplexer 600 according to an embodiment.

The ICBC-X multiplexer 600 includes an ICBC-X standard cell 601 as illustrated in FIG. 5.

The output signal Y is fed, together with an input signal A, to a first OR of an ANDOR gate 602.

The output signal Z is fed, together with an input signal B, to a second OR of the ANDOR gate 602.

The output signal of the ANDOR gate 602 is given by $$C=(SA+A)\cdot(SB+B)=(\overline{S}+\overline{X}+A)\cdot(\overline{S}+X+B)=\overline{S}+X\cdot A+\overline{X}\cdot B.$$

This means that if the ICBC-X is enabled (i.e. for S=1) either A or B is selected to be output C, whereas for S=0 the output C is set to 1.

Figure 7:
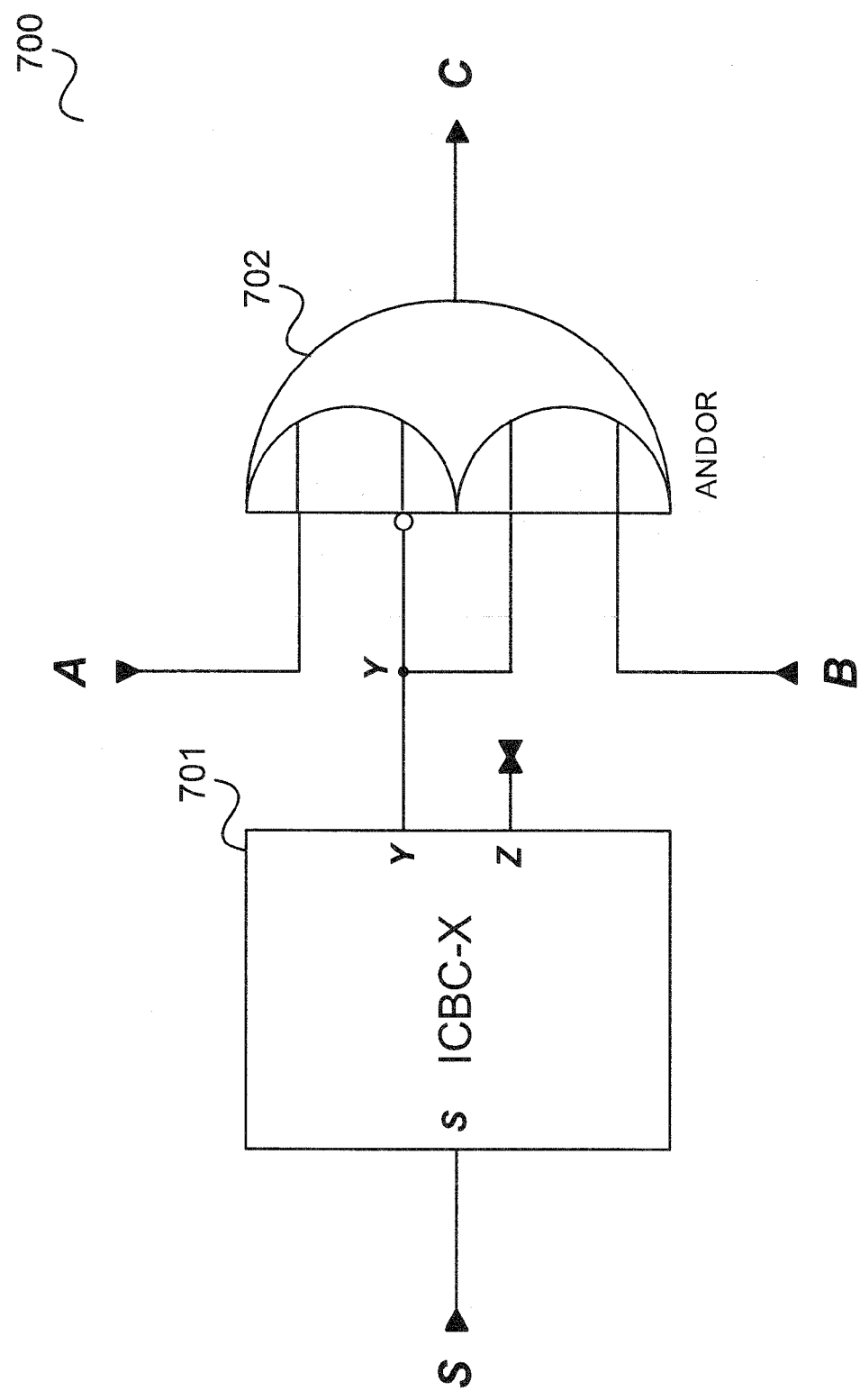
FIG. 7 shows an ICBC-X multiplexer according to another embodiment.

FIG. 7 shows an ICBC-X multiplexer 700 according to another embodiment.

The ICBC-X multiplexer 700 includes an ICBC-X standard cell 701 as illustrated in FIG. 5.

The output signal Y is inverted and fed, together with an input signal A, to a first OR of an ANDOR gate 702.

Further, the output signal Y is fed, together with an input signal B, to a second OR of the ANDOR gate 702.

The output signal of the ANDOR gate 702 is given by $$C=(\overline{Y}+A)\cdot(Y+B)=(S\cdot X+A)\cdot(\overline{S}+\overline{X}+B)=S\cdot X\cdot A+\overline{S}\cdot\overline{X}\cdot B.$$

This means that if the ICBC-X is enabled (i.e. for S=1) either B or A is selected to be output C, whereas for S=0 the output C is set to A.

Accordingly, with this or similar circuitry it is in possible to realize reverse engineering resistant permutations of data path elements, e.g. S-box permutations or different ALU configurations.

The complexity of the reverse engineering can even be increased by concatenating ICBC-Xs, i.e. by connecting ICBC-X outputs to the select input (i.e. the input terminal for input signal S) of another ICBC-X (either of the same type (i.e. ICBC-0 or ICBC-1) or a different type). In this way complex unidentifiable logic functions can be realized.

Static components (shares) for an encryption or decryption key can be realized by using several ICBC-X cells. This means that the hidden values X are used to modify some secret values Y stored in non-volatile memory by applying some (e.g. cryptographic) function G, i.e. Z=G(X,Y). The value Z can for example be used as a configuration setting for the chip, as an encryption key (e.g. for a memory, e.g. for AES (Advanced Encryption Standard) encryption), etc.

To render the individual characterization of an ICBC-X cell more difficult the cell may be almost always kept in the disabled mode (i.e. in precharge state) except for a short time interval when its hidden value (0 or 1 for X) is read out. The value may for example be immediately used, e.g. in some state machine or as a secret key value, and then the cell is switched back to the precharge mode. The time interval when the cell is read could be randomized to further increase the effort for a successful attack.

As a second option, the ICBC-X cell can be kept disabled except for a short period of time in which the hidden value is copied to some transient memory element (e.g. a register, a latch, or RAM). Then the ICBC-X cell is disabled again and the logic function/secret value is solely obtainable by retrieving it from the memory element. Thus, the secret value is deleted in every power-down of the chip which increases security.

An ICBC-X cell can be combined with a sequential device, e.g. with a master-slave flip-flop in order to conceal the flip-flop's initial value. An example is shown in FIG. 8.

Figure 8:
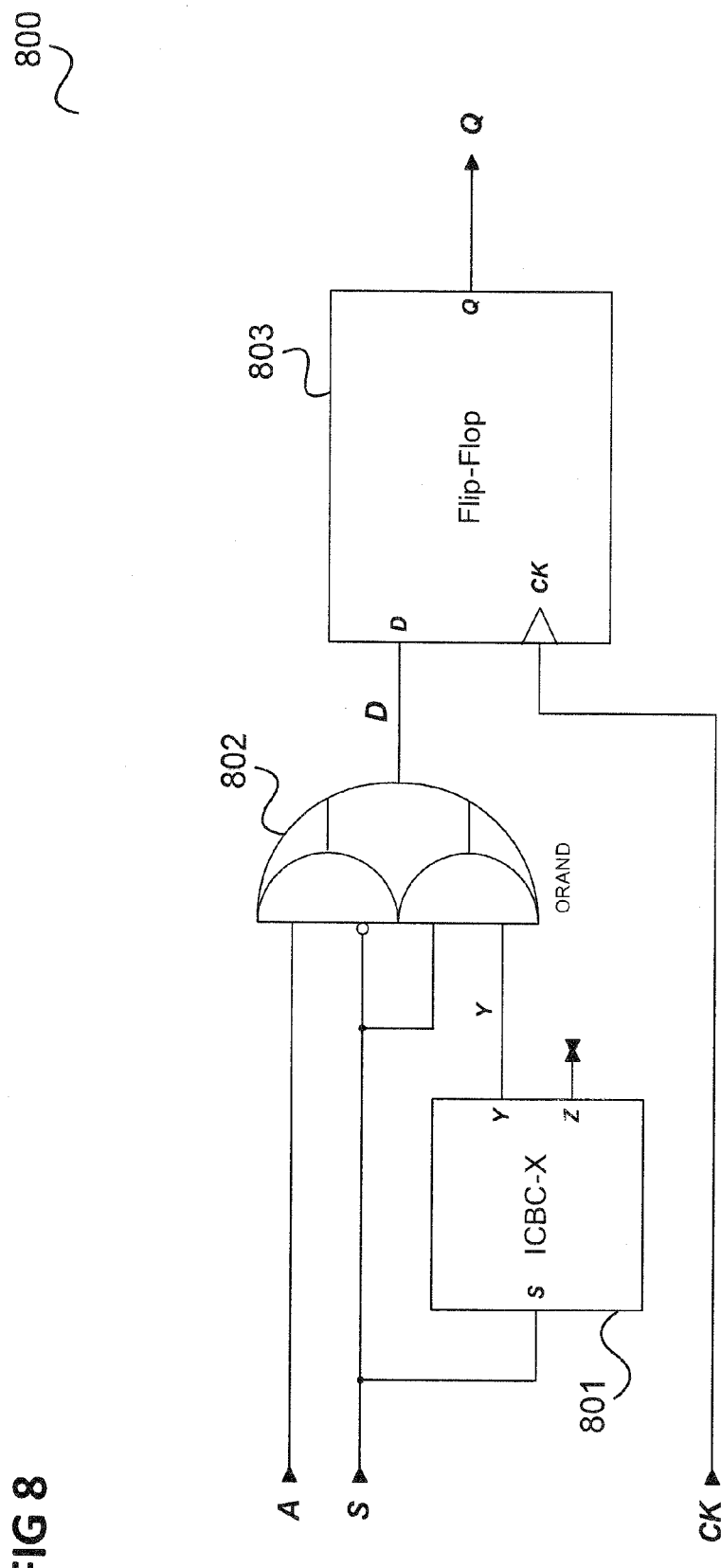
FIG. 8 shows a flip-flop initialization circuit.

FIG. 8 shows a flip-flop initialization circuit 800.

The circuit 800 includes an ICBC-X cell 801 as illustrated in FIG. 5.

The input signal S and the output signal Y are fed to a first AND of an ORAND gate 802.

An input signal A and the inverted input signal S are fed to a second AND of the ORAND gate 802.

The circuit 800 further includes a D-flip-flop 803 which is supplied with a clock signal CK at its clock input and with the output signal D of the ORAND gate 802 at its D input.

For initialization, S is set to 1 thereby enabling the ICBC-X cell 801 and selecting Y for the flip-flop's input D with the ORAND-multiplexer 802, so that Y is written into the flip-flop 803 upon a rising edge of its clock CK. When S is then reset again to 0, the ICBC-X cell 801 is reset to precharge, and for D the "regular" input A is selected by the multiplexer 802.

Applying this dodge to a state machine, i.e. if A is a function of Q (and other flip-flop outputs representing a current state of the state machine), it is possible to initialize the state machine with a secret state that cannot be identified by (typical) reverse engineering and increases the effort for other analysis methods. An example, a sequential toggle cell, is illustrated in FIG. 9.

Figure 9:
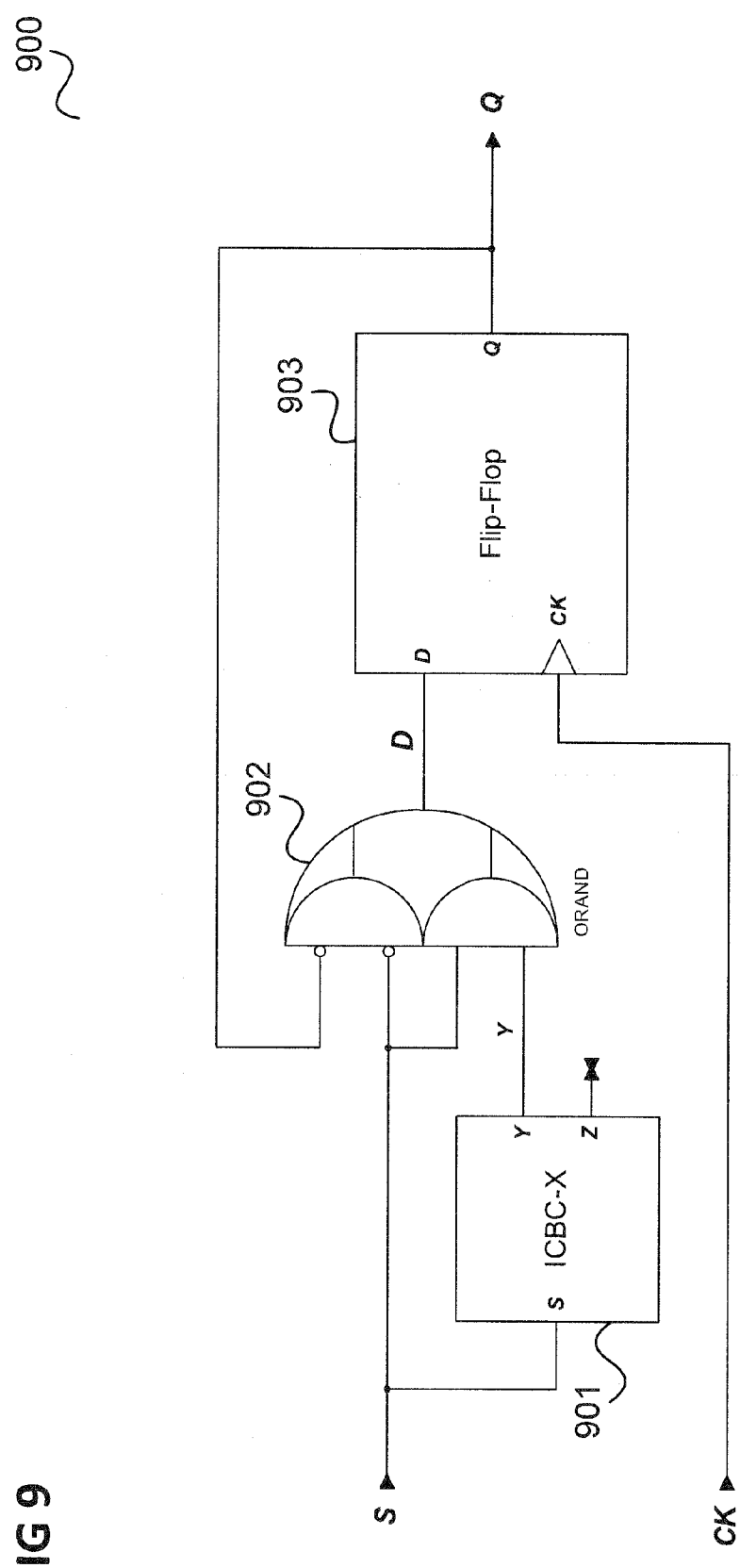
FIG. 9 shows an ICBC-X toggle flip-flop circuit.

FIG. 9 shows an ICBC-X toggle flip-flop circuit 900.

The circuit 900 includes an ICBC-X cell 901 as illustrated in FIG. 5.

The input signal S and the output signal Y are fed to a first AND of an ORAND gate 902.

The inverted output signal Q of a D-flip-flop 903 and the inverted input signal S are fed to a second AND of the ORAND gate 802.

The D-flip-flop 903 is supplied with a clock signal CK at its clock input and with the output signal D of the ORAND gate 902 at its D input.

As above, the ICBC-X cell 901 represents an intrinsic and hidden Boolean value. In the sequential toggle cell as implemented by the circuit 900 an additional multiplexer (ORAND 902) and the flip-flop 903 are attached to the ICBC-X cell 901. On reset (signal S enabled) the flip-flop 903 takes the X value from the ICBC-X cell 901. Each time an active clock edge is applied by the clock signal CK the value in the flip flop and hence the flip-flop output signal Q, is complemented.

The circuit 900 can be used in finite state machines or counter type structures to implement next-state functions with a hidden encoding. It should be noted that the circuitry of the ICBC-X, the multiplexer and the flip-flop can be combined and integrated into one single optimized circuit.

Figure 10:
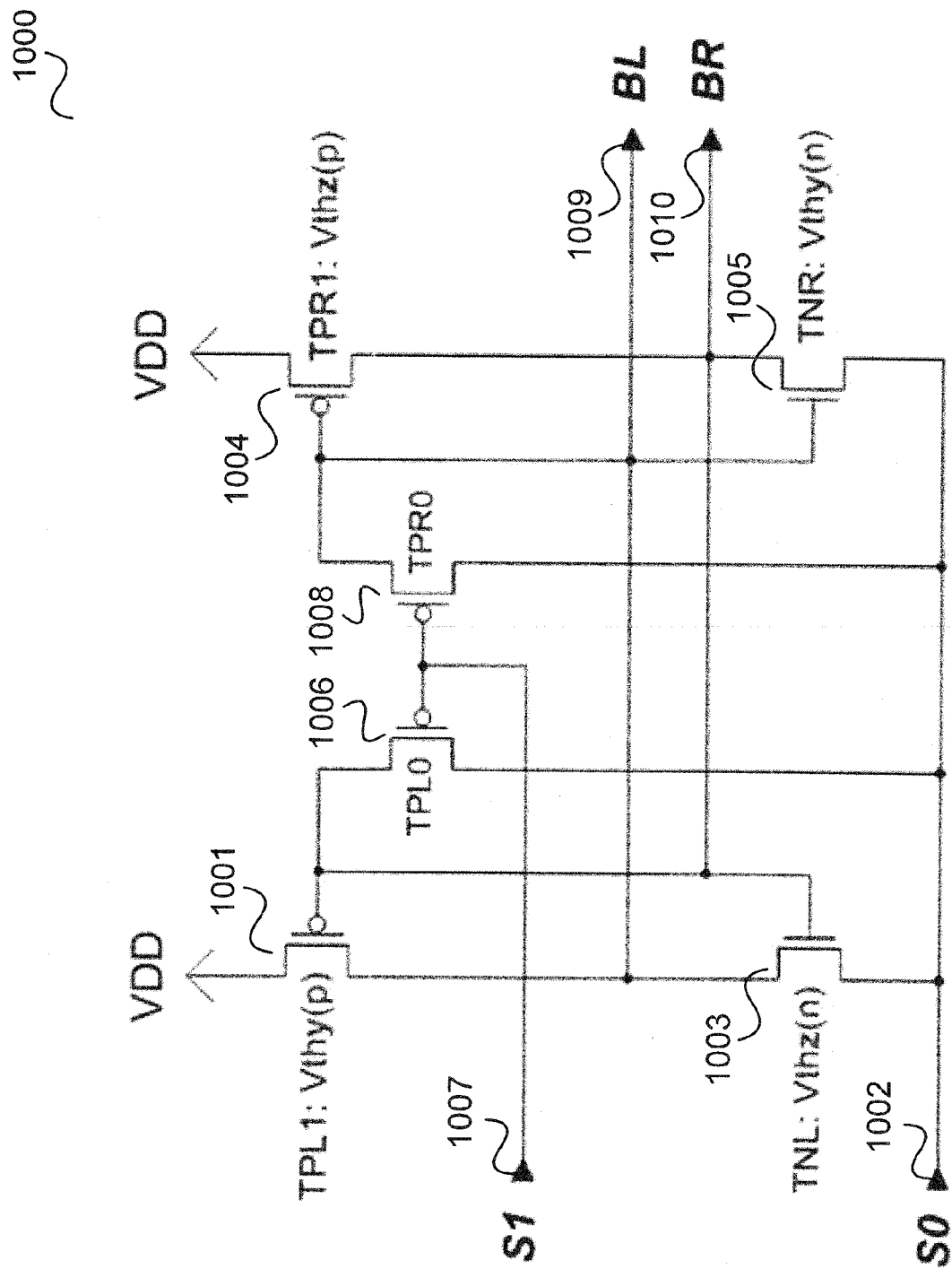
FIG. 10 shows an ICBC-X according to another embodiment.

FIG. 10 shows an ICBC-X 1000 according to another embodiment.

In the ICBC-X 1000, the roles of the p channel FETs and the n channel FETs are interchanged with respect to the ICBC-X 300 shown in FIG. 3.

The ICBC-X 1000 includes a first p channel FET (field effect transistor) 1001 whose source terminal is connected to a high supply potential (VDD), whose drain is connected to the drain terminal of a first n channel FET 1003 and whose gate is connected to the gate of the first n channel FET 1003. The source of the first n channel FET 1003 is coupled to a first input terminal 1002 receiving an input signal S0.

The ICBC-X 1000 further includes a second p channel FET 1004 whose source terminal is connected to the high supply potential, whose drain is connected to the drain terminal of a second n channel FET 1005 and whose gate is connected to the gate of the second n channel FET 1005. The source of the second n channel FET 1005 is coupled to the first input terminal 1002.

The gate of the first p channel FET 1001 is further coupled to the source of a third p channel FET 1006 whose drain is connected to the first input terminal 1002 and whose gate is connected to a second input terminal 1007 receiving an input signal S1.

The gate of the second p channel FET 1004 is further coupled to the source of a fourth p channel FET 1008 whose drain is connected to the first input terminal 1002 and whose gate is connected to the second input terminal 1007.

Further, the drain of the first n channel FET 1003 is connected to the gate of the second n channel FET 1005. This connection is further connected to a first output terminal 1009 outputting an output signal BL.

Similarly, the drain of the second n channel FET 1005 is connected to the gate of the first n channel FET 1003 and this connection is further connected to a second output terminal 1010 outputting an output signal BR.

Again, the PRECHARGE state is defined by the input values S1=0, S0=1, now resulting in both outputs at 1, i.e. BL=BR=1.

The VALID state is again defined by the complementary input values S1=1, S0=0, resulting in either (BL, BR)=(1,0) for {Vthz(p)>Vthy(p)} AND {Vthz(n)>Vthy(n)} or (BL, BR)=(0,1) for {Vthz(p)<Vthy(p)} AND {Vthz(n)<Vthy(n)}.

Further alternatives to realize ICBC-Xs for example include RS-Latches (i.e. cross-coupled NAND or NOR gates) whose components (the NAND or NOR gates) are structurally identically implemented but whose transfer characteristics is asymmetric due to appropriate use of FETs (e.g. MOS devices) with different threshold voltages resulting in a robust 1 or 0 at the outputs when challenged with an input pattern that would otherwise correspond to a metastable state.

Examples for this are shown with FIGS. 11 to 15 representing different realizations of RSX latches, i.e. latches that can be set to (BL, BR)=(1,0) by setting (EN, SL, SR)=(1, 1, 0),
(BL, BR)=(0,1) by setting (EN, SL, SR)=(1, 0, 1),
(BL, BR)=(X, $\bar{X}$) with the transition (EN, SL, SR)=(0, 1, 1)→(1, 1, 1), that is a forbidden transition for a conventional RS-Latch since it causes an undefined logical state.

In contrast to the ICBC-Xs of FIGS. 3 and 10, the RSX latches 1100, 1200, 1300, 1400 shown in FIGS. 11 to 14 have three inputs. However, the usage of RSX latches may be desirable because they can be seen to have the additional camouflage property of being disguised as RS-Latches, deceiving and leading astray reverse engineering.

It should be noted that in all application examples given above, any one of the RSX latches described in the following can be used instead of the ICBC-X circuit (or ICBC-X cell).

Figure 11:
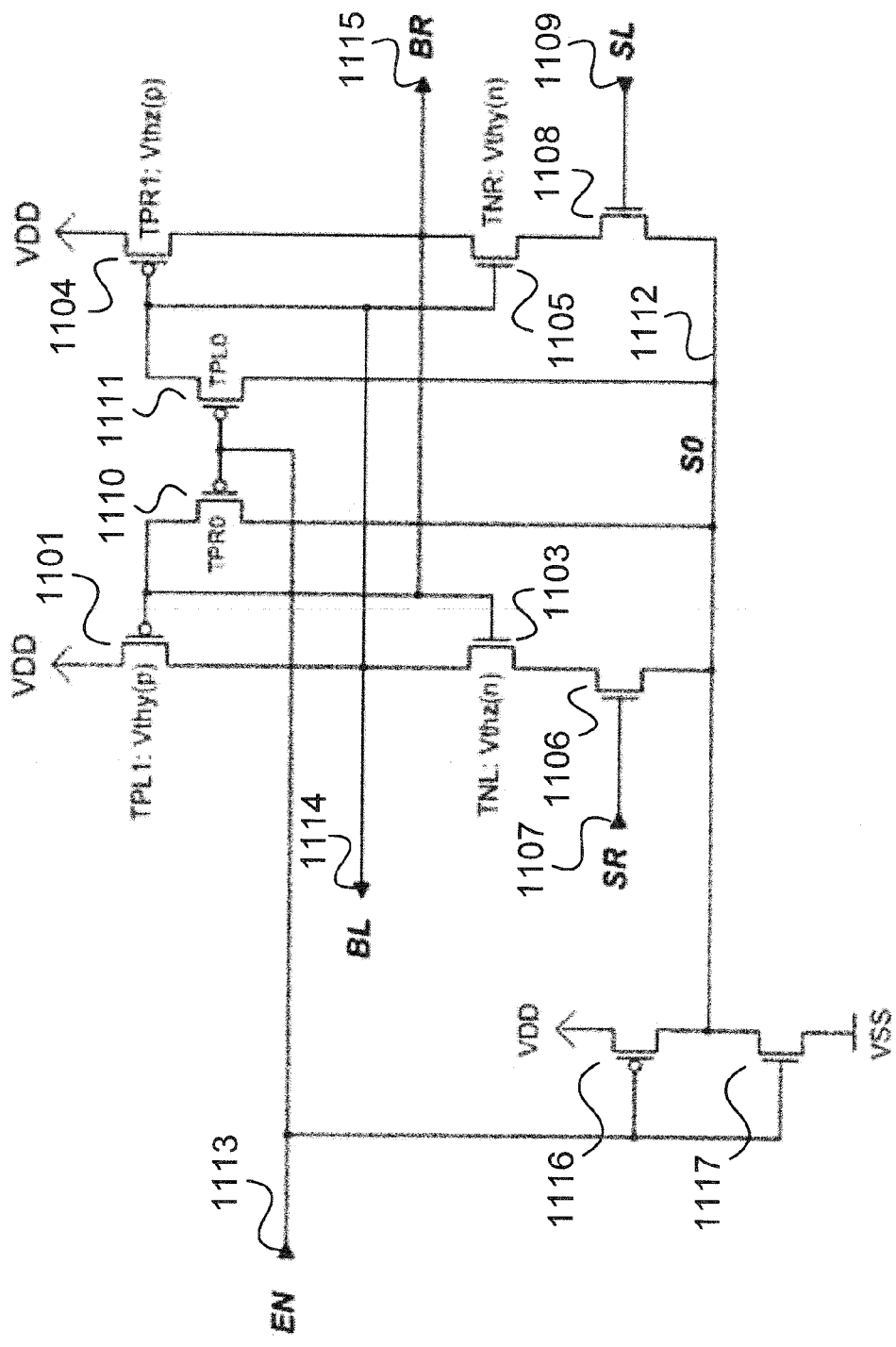
FIG. 11 shows an RSX latch according to an embodiment.

FIG. 11 shows an RSX latch 1100 according to an embodiment.

The RSX latch 1100 includes a first p channel FET 1101 whose source terminal is connected to a high supply potential (VDD), whose drain is connected to the drain terminal of a first n channel FET 1103 and whose gate is connected to the gate of the first n channel FET 1103.

The RSX latch 1100 further includes a second p channel FET 1104 whose source terminal is connected to the high supply potential, whose drain is connected to the drain terminal of a second n channel FET 1105 and whose gate is connected to the gate of the second n channel FET 1105.

The source of the first n channel FET 1103 is coupled to the drain terminal of a third n channel FET 1106 whose gate is coupled to a first input terminal 1107 receiving an input signal SR and whose source is coupled to a node 1112 corresponding to a signal S0.

The source of the second n channel FET 1105 is coupled to the drain terminal of a fourth n channel FET 1108 whose gate is coupled to a second input terminal 1109 receiving an input signal SL and whose source is coupled to the node 1112.

The gate of the first p channel FET 1101 is further coupled to the source of a third p channel FET 1110 whose drain is connected to the node 1112 and whose gate is connected to a third input terminal 1113 receiving an input signal EN.

The gate of the second p channel FET 1104 is further coupled to the source of a fourth p channel FET 1111 whose drain is connected to the node 1112 and whose gate is connected to the third input terminal 1113.

Further, the drain of the first n channel FET 1103 is connected to the gate of the second n channel FET 1105. This connection is further connected to a first output terminal 1114 outputting an output signal BL.

Similarly, the drain of the second n channel FET 1105 is connected to the gate of the first n channel FET 1103 and this connection is further connected to a second output terminal 1115 outputting an output signal BR.

The node 1112 is connected to the drain of a fifth p channel FET 1116 whose source is connected to the high supply potential and whose gate is connected to the third input terminal 1113.

The node 1112 is further connected to the drain of a fifth n channel FET 1117 whose source is connected to the low supply potential and whose gate is connected to the third input terminal 1113.

Figure 12:
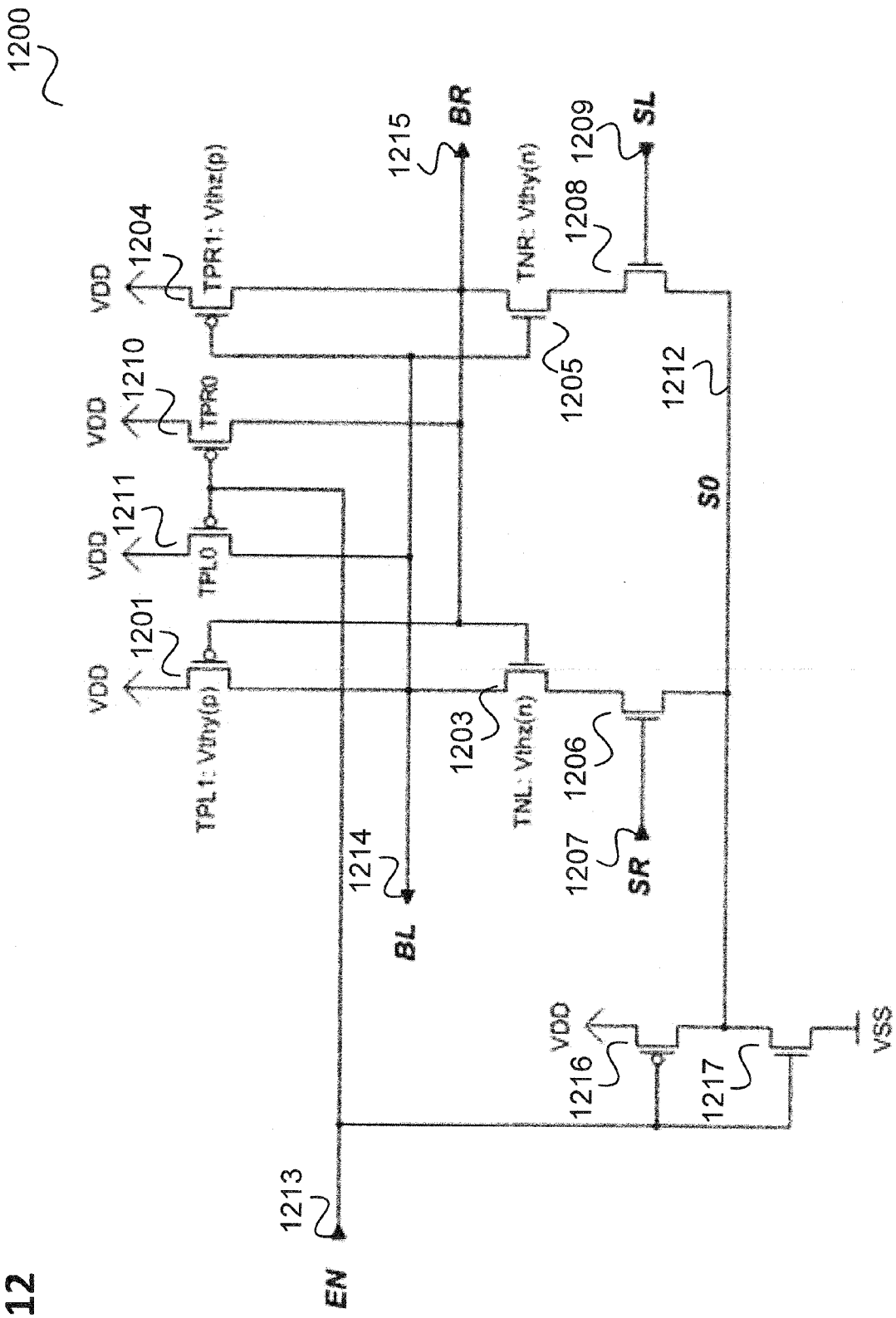
FIG. 12 shows an RSX latch according to another embodiment.

FIG. 12 shows an RSX latch 1200 according to another embodiment.

The RSX latch 1200 includes a first p channel FET 1201 whose source terminal is connected to a high supply potential (VDD), whose drain is connected to the drain terminal of a first n channel FET 1203 and whose gate is connected to the gate of the first n channel FET 1203.

The RSX latch 1200 further includes a second p channel FET 1204 whose source terminal is connected to the high supply potential, whose drain is connected to the drain terminal of a second n channel FET 1205 and whose gate is connected to the gate of the second n channel FET 1205.

The source of the first n channel FET 1203 is coupled to the drain terminal of a third n channel FET 1206 whose gate is coupled to a first input terminal 1207 receiving an input signal SR and whose source is coupled to a node 1212 corresponding to a signal S0.

The source of the second n channel FET 1205 is coupled to the drain terminal of a fourth n channel FET 1208 whose gate is coupled to a second input terminal 1209 receiving an input signal SL and whose source is coupled to the node 1212.

The gate of the first p channel FET 1201 is further coupled to the drain of a third p channel FET 1210 whose source is connected to the high supply potential and whose gate is connected to a third input terminal 1213 receiving an input signal EN.

The gate of the second p channel FET 1204 is further coupled to the drain of a fourth p channel FET 1211 whose source is connected to the high supply potential and whose gate is connected to the third input terminal 1213.

Further, the drain of the first n channel FET 1203 is connected to the gate of the second n channel FET 1205. This connection is further connected to a first output terminal 1214 outputting an output signal BL.

Similarly, the drain of the second n channel FET 1205 is connected to the gate of the first n channel FET 1203 and this connection is further connected to a second output terminal 1215 outputting an output signal BR.

The node 1212 is connected to the drain of a fifth p channel FET 1216 whose source is connected to the high supply potential and whose gate is connected to the third input terminal 1213.

The node 1212 is further connected to the drain of a fifth n channel FET 1217 whose source is connected to the low supply potential and whose gate is connected to the third input terminal 1213.

Figure 13:
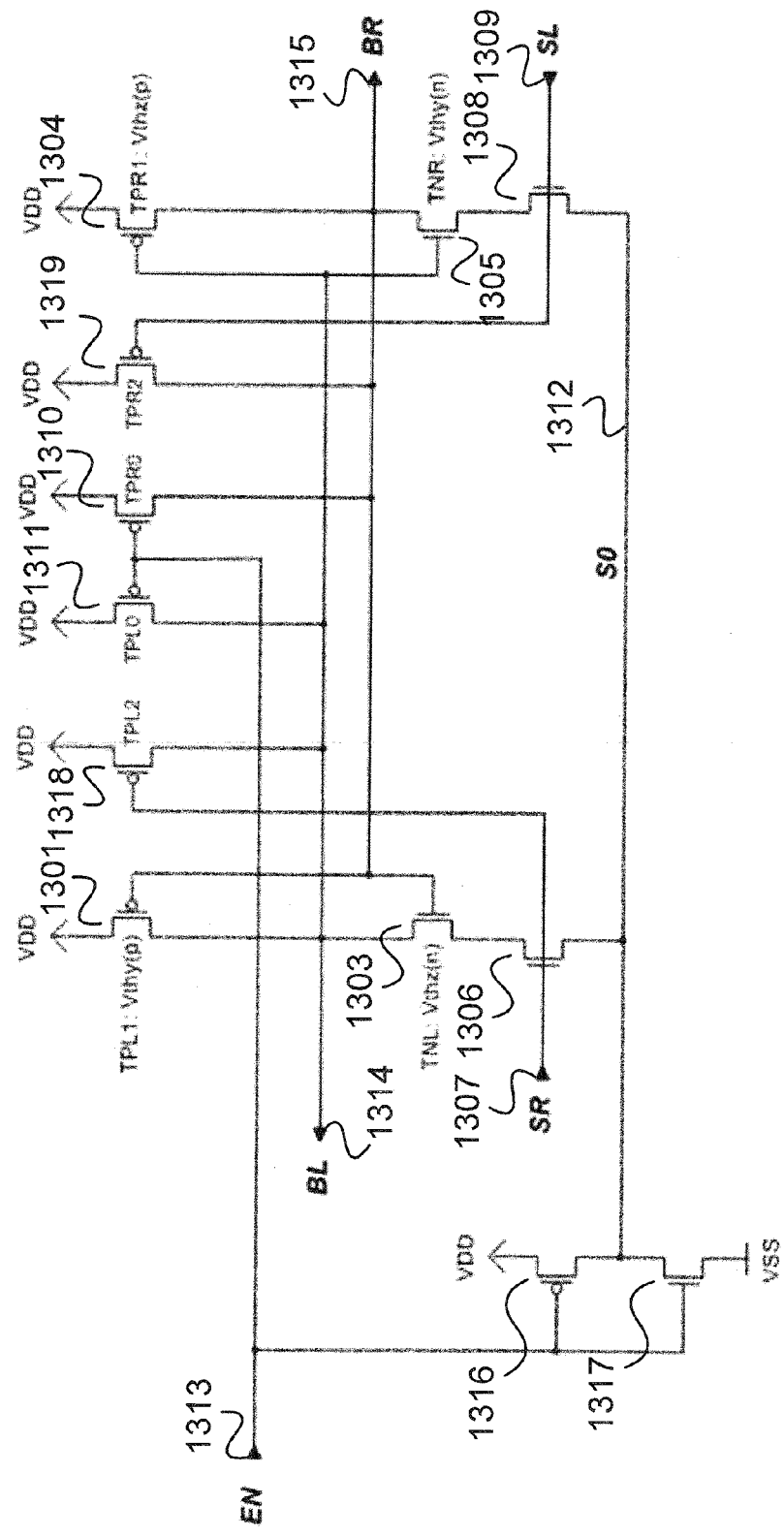
FIG. 13 shows an RSX latch according to another embodiment.

FIG. 13 shows an RSX latch 1300 according to another embodiment.

The RSX latch 1300 includes a first p channel FET 1301 whose source terminal is connected to a high supply potential (VDD), whose drain is connected to the drain terminal of a first n channel FET 1303 and whose gate is connected to the gate of the first n channel FET 1303.

The RSX latch 1300 further includes a second p channel FET 1304 whose source terminal is connected to the high supply potential, whose drain is connected to the drain terminal of a second n channel FET 1305 and whose gate is connected to the gate of the second n channel FET 1305.

The source of the first n channel FET 1303 is coupled to the drain terminal of a third n channel FET 1306 whose gate is coupled to a first input terminal 1307 receiving an input signal SR and whose source is coupled to a node 1312 corresponding to a signal S0.

The source of the second n channel FET 1305 is coupled to the drain terminal of a fourth n channel FET 1308 whose gate is coupled to a second input terminal 1309 receiving an input signal SL and whose source is coupled to the node 1312.

The gate of the first p channel FET 1301 is further coupled to the drain of a third p channel FET 1310 whose source is connected to the high supply potential and whose gate is connected to a third input terminal 1313 receiving an input signal EN.

The gate of the second p channel FET 1304 is further coupled to the drain of a fourth p channel FET 1311 whose source is connected to the high supply potential and whose gate is connected to the third input terminal 1313.

Further, the drain of the first n channel FET 1303 is connected to the gate of the second n channel FET 1305. This connection is further connected to a first output terminal 1314 outputting an output signal BL.

Similarly, the drain of the second n channel FET 1305 is connected to the gate of the first n channel FET 1303 and this connection is further connected to a second output terminal 1315 outputting an output signal BR.

The node 1312 is connected to the drain of a fifth p channel FET 1316 whose source is connected to the high supply potential and whose gate is connected to the third input terminal 1313.

The node 1312 is further connected to the drain of a fifth n channel FET 1317 whose source is connected to the low supply potential and whose gate is connected to the third input terminal 1313.

Furthermore, the first input terminal 1307 is connected to the gate of a sixth p channel transistor 1318 whose source is connected to the high supply potential and whose drain is connected to the first output terminal 1314.

The second input terminal 1309 is connected to the gate of a seventh p channel transistor 1319 whose source is connected to the high supply potential and whose drain is connected to the second output terminal 1315.

Figure 14:
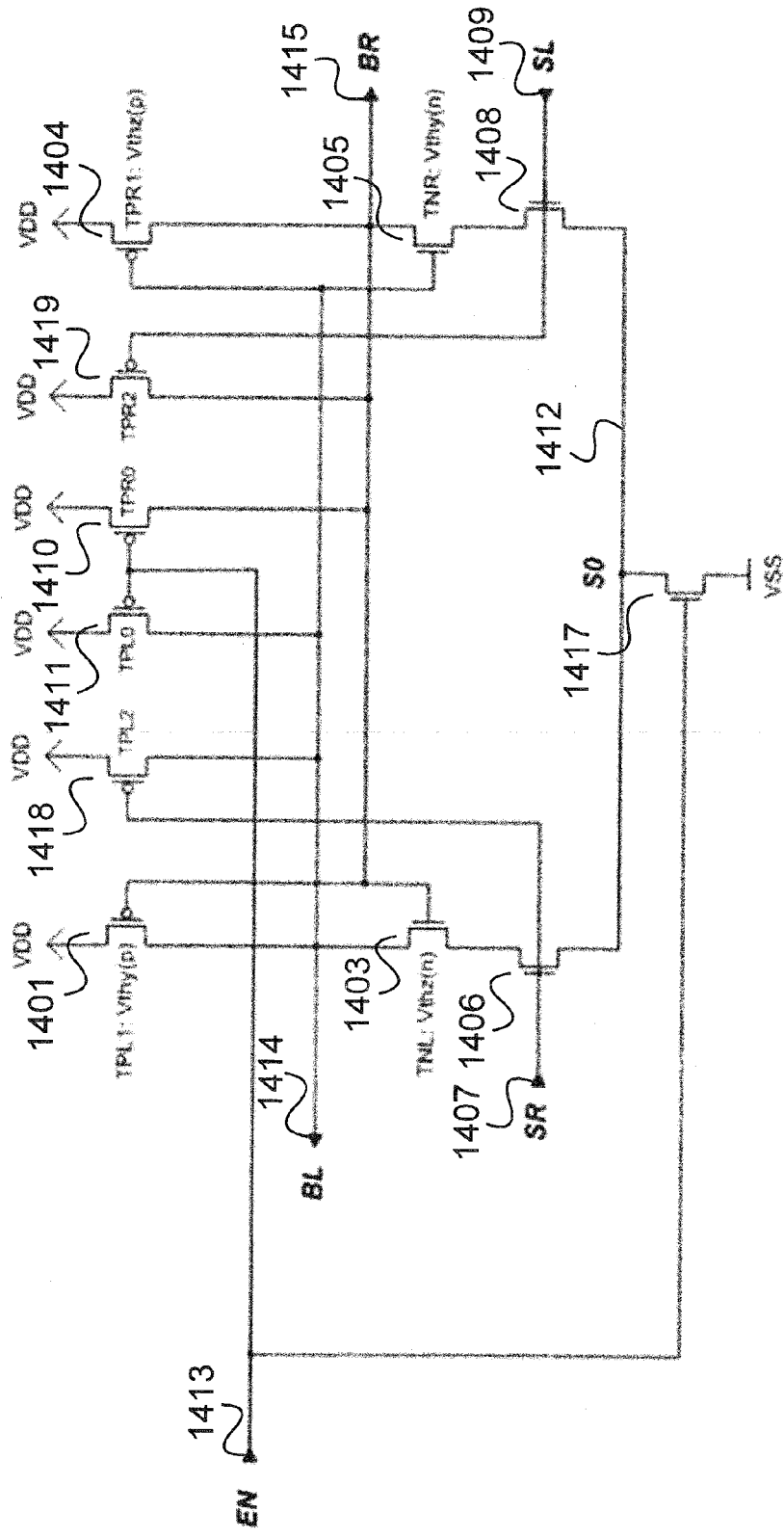
FIG. 14 shows an RSX latch according to another embodiment.

FIG. 14 shows an RSX latch 1400 according to another embodiment.

The RSX latch 1400 includes a first p channel FET 1401 whose source terminal is connected to a high supply potential (VDD), whose drain is connected to the drain terminal of a first n channel FET 1403 and whose gate is connected to the gate of the first n channel FET 1403.

The RSX latch 1400 further includes a second p channel FET 1404 whose source terminal is connected to the high supply potential, whose drain is connected to the drain terminal of a second n channel FET 1405 and whose gate is connected to the gate of the second n channel FET 1405.

The source of the first n channel FET 1403 is coupled to the drain terminal of a third n channel FET 1406 whose gate is coupled to a first input terminal 1407 receiving an input signal SR and whose source is coupled to a node 1412 corresponding to a signal S0.

The source of the second n channel FET 1405 is coupled to the drain terminal of a fourth n channel FET 1408 whose gate is coupled to a second input terminal 1409 receiving an input signal SL and whose source is coupled to the node 1412.

The gate of the first p channel FET 1401 is further coupled to the drain of a third p channel FET 1410 whose source is connected to the high supply potential and whose gate is connected to a third input terminal 1413 receiving an input signal EN.

The gate of the second p channel FET 1404 is further coupled to the drain of a fourth p channel FET 1411 whose source is connected to the high supply potential and whose gate is connected to the third input terminal 1413.

Further, the drain of the first n channel FET 1403 is connected to the gate of the second n channel FET 1405. This connection is further connected to a first output terminal 1414 outputting an output signal BL.

Similarly, the drain of the second n channel FET 1405 is connected to the gate of the first n channel FET 1403 and this connection is further connected to a second output terminal 1415 outputting an output signal BR.

The node 1412 is connected to the drain of a fifth n channel FET 1417 whose source is connected to the low supply potential and whose gate is connected to the third input terminal 1413.

Furthermore, the first input terminal 1407 is connected to the gate of a sixth p channel transistor 1418 whose source is connected to the high supply potential and whose drain is connected to the first output terminal 1414.

The second input terminal 1409 is connected to the gate of a seventh p channel transistor 1419 whose source is connected to the high supply potential and whose drain is connected to the second output terminal 1415.

A further option to realize ICBC-Xs includes deploying pairs of Differential Feedback Transfer Gates (DFTG) featuring the same physical design but appropriately different threshold voltages of its FETs (e.g. nMOS and/or pMOS devices), in combination with a bit cell to store the ICBC-X's response.

Figure 15:
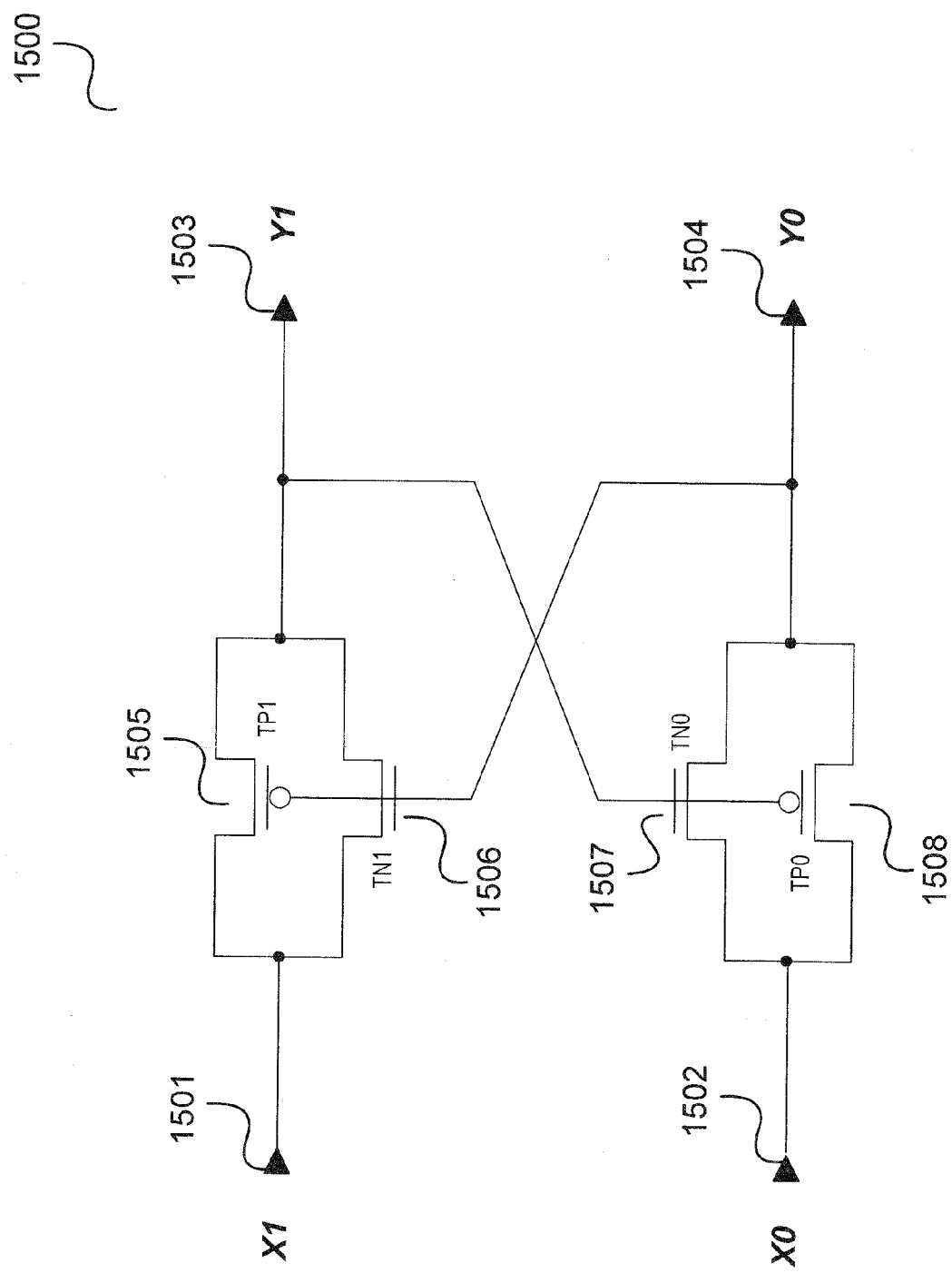
FIG. 15 shows a DFTG 1500.

FIG. 15 shows a DFTG 1500.

The DFTG 1500 includes a first input terminal 1501, a first input terminal 1502, a first output terminal 1503 and a second output terminal 1504.

A first p channel FET 1505 is connected between the first input terminal 1501 and the first output terminal 1503. In parallel thereto, a first n channel FET 1506 is connected between the first input terminal 1501 and the first output terminal 1503.

A second n channel FET 1507 is connected between the second input terminal 1502 and the second output terminal 1504. In parallel thereto, a second p channel FET 1508 is connected between the second input terminal 1502 and the second output terminal 1504.

The first output terminal 1503 is fed back to the gates of the second n channel FET 1507 and the second p channel FET 1508.

The second output terminal 1504 is fed back to the gates of the first p channel FET 1505 and the first n channel FET 1506.

The differences between the threshold voltages of the FETs (i.e. the difference between the threshold voltages of the p channel FETs 1505, 1508 and the difference between the threshold voltages of the n channel FETs 1506, 1507) may be chosen to be very small, since the DFTG circuit 1500 is of particular sensitivity with respect to the FET (e.g. MOS device) transfer characteristics.

In the course of an IC fabrication process, the different threshold voltages (e.g. in flavors like low-Vth, standard-Vth, and high-Vth) of nMOSFETs and pMOSFETs may be adjusted by means of different ion implantation dosages, resulting in different donator and/or acceptor concentrations within the MOSFET's n-channel and p-channel regions as well as within the transition regions between the channel and the source and drain diodes.

In this way, for Deep-Sub-Micron (DSM) technologies (like, e.g. a 65 nm-technology), values of 100 . . . 200 mV are typically specified and realized for the differences between neighboring threshold flavors: for instance about 350 mV for a standard-Vth MOSFET and 520 mV for a high-Vth MOSFET. It should be noted, however, that, due to the statistical nature of ion implantation processes, the specified Vth values represent only targets for statistical mean values of Vth frequency distributions for all the individual MOSFETs. That is, the unavoidable process fluctuations also entail deviations from the Vth mean values µ[Vth] (measured in units of root mean square or standard deviation σ). These standard deviations lie in the range of 15 to 25 mV for adjacent and geometrically identical MOSFET of the same Vth flavor in DSM technologies (the corresponding fluctuations due to thermal noise lie in the range of 1-2 mV for temperatures between 300 and 400K).

From the above described process technology characteristics, a criterion may be derived for the minimum required distance between two different Vth flavours that are to be deployed for robust ICBC-X and RSX implementations with sufficiently high yield with respect to process fluctuations (e.g. >99.9% yield for a chip featuring some 250 ICBC-X instances).

First of all it can be observed that the local and uncorrelated random Vth variations are normally distributed (not considered are correlated Vth variations due to e.g. gate-poly length fluctuations) with the CDF (Cumulative Distribution Function)

$$CDF(x) = \frac{1}{\sigma \cdot \sqrt{2\pi}} \int_{-\infty}^{x} dx' \cdot e^{-\frac{1}{2}\left(\frac{x'-\mu}{\sigma}\right)^2}$$

where CDF(x) denotes the probability that a random variable X (in this case X=Vth) assumes a value between −∞ and x.

Moreover, since the two different Vth flavours Vth(z) and Vth(y) are normally distributed, statistically independent, and (according to the above worst case assumption) uncorrelated, the (random) difference Vth(z)−Vth(y) is also normally distributed with mean value Δµ=µ[Vth(z)]−µ[Vth(y)] and variance σ²=σ²(z)+σ²(y)

where Vth(z) and Vth(y) denote the (random) values of the different Vth flavours.

For instance, Vth(z) corresponds to the high-Vth and Vth (y) to the standard-Vth flavour if these two Vth flavours are to be deployed for ICBC-X implementation.

Then, the probability $p(Vth(z)-Vth(y)<V_m)$ for the difference Vth(z)−Vth(y) being smaller than a certain margin $V_m$ is given by $$p(Vth(z) - Vth(y) < V_m) = \frac{1}{\sqrt{2\pi}} \int_{-\infty}^{\frac{V_m-\Delta\mu}{\sigma}} dt \cdot e^{-\frac{1}{2}t^2}$$

It should be noted that p (Vth(z)−Vth(y)<$V_m$) denotes the probability, as a function of $V_m$, Δµ and σ, for a single ICBC instance to be considered not stable enough for reliable productive use.

Now let it be required that the "partial ICBC yield" $Y_{ICBC}$ for a chip featuring N ICBC (or RSX) instances shall be at least $Y_C$. This gives the desired criterion:

$Y_{ICBC}=[1-p(Vth(z)-Vth(y)<V_m)]^N > Y_C$

For instance, the case of N=250 and $Y_C$=0.999 is achieved if

Δµ=µ[Vth(z)]−µ[Vth(y)]≥137 mV when it is assumed that σ(y)=σ(x)=20 mV and $V_m$=10 mV is required.

"Very high yield with respect to process fluctuations" may for example be understood to mean that single inevitable faulty ICBC-X instances occur so infrequently that they can be neglected in the sense that other inevitable yield detractors like "gate oxide damage" etc. occur comparatively much more frequently.

In order to realise robust IXBC-X or RSX implementations with very high yield also for higher N and/or $Y_C$, not only one MOSFET pair but two or more MOSFET pairs within the ICBC-X or RSX may be implemented with different Vth flavours. This is illustrated in FIG. 16.

Figure 16:
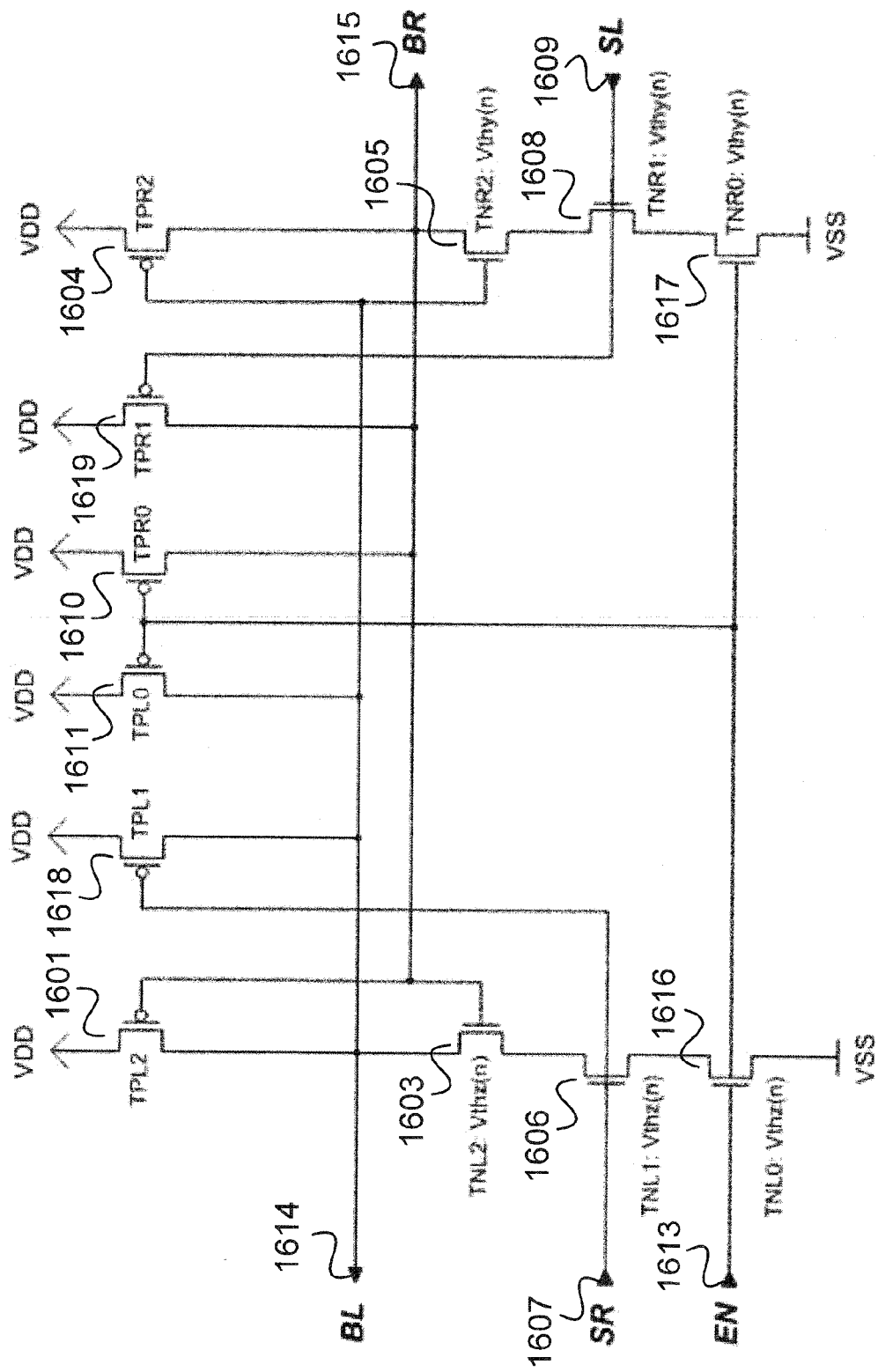
FIG. 16 shows an RSX latch 1600 according to another embodiment.

FIG. 16 shows an RSX latch 1600 according to another embodiment.

The RSX latch 1600 includes a first p channel FET 1601 whose source terminal is connected to a high supply potential (VDD), whose drain is connected to the drain terminal of a first n channel FET 1603 and whose gate is connected to the gate of the first n channel FET 1603.

The RSX latch 1600 further includes a second p channel FET 1604 whose source terminal is connected to the high supply potential, whose drain is connected to the drain terminal of a second n channel FET 1605 and whose gate is connected to the gate of the second n channel FET 1605.

The source of the first n channel FET 1603 is coupled to the drain terminal of a third n channel FET 1606 whose gate is coupled to a first input terminal 1607 receiving an input signal SR.

The source of the second n channel FET 1605 is coupled to the drain terminal of a fourth n channel FET 1608 whose gate is coupled to a second input terminal 1609 receiving an input signal SL.

The gate of the first p channel FET 1601 is further coupled to the drain of a third p channel FET 1610 whose source is connected to the high supply potential and whose gate is connected to a third input terminal 1613 receiving an input signal EN.

The gate of the second p channel FET 1604 is further coupled to the drain of a fourth p channel FET 1611 whose source is connected to the high supply potential and whose gate is connected to the third input terminal 1613.

Further, the drain of the first n channel FET 1603 is connected to the gate of the second n channel FET 1605. This connection is further connected to a first output terminal 1614 outputting an output signal BL.

Similarly, the drain of the second n channel FET 1605 is connected to the gate of the first n channel FET 1603 and this connection is further connected to a second output terminal 1615 outputting an output signal BR.

The source of the third n channel FET 1606 is connected to the drain of a fifth n channel FET 1616 whose gate is connected to the third input terminal 1613 and whose source is connected to the low supply potential.

The source of the fourth n channel FET 1608 is connected to the drain of a sixth n channel FET 1617 whose gate is connected to the third input terminal 1613 and whose source is connected to the low supply potential.

Furthermore, the first input terminal 1607 is connected to the gate of a sixth p channel transistor 1618 whose source is connected to the high supply potential and whose drain is connected to the first output terminal 1614.

The second input terminal 1609 is connected to the gate of a seventh p channel transistor 1619 whose source is connected to the high supply potential and whose drain is connected to the second output terminal 1615.

In other words, the RSX-Latch 1600 includes two NAND-3 gates with cross-coupled feedbacks from the output signals BL and BR. For example, all p channel FETs (e.g. pMOSFETs) are implemented with the same Vth flavor, while the first n channel FET 1603, the third n channel FET 1606 and the fifth n channel FET 1616 (e.g. nMOSFETs) each have a first threshold voltage Vthz(n), in contrast to their three (e.g. nMOS) counterparts the second n channel FET 1605, the fourth n channel FET 1608 and the sixth n channel FET 1617 exhibiting a second threshold voltage Vthy(n) different from Vthz(n).

Since the local variations of adjacent MOSFETs are, at least in very good approximation, statistically independent, a much higher probability for robust RSX transition characteristics results, compared to the case of only one pair (e.g. only first n channel FET 1603 and the second n channel FET 1605) with different Vth flavors.

Accordingly, $\Delta\mu$ may be reduced to some extent, for instance to $\Delta\mu \geq 90$ mV, without losing the advantage of high yield prediction relative to the case of only one FET pair with different Vth flavors.

This may for example be applied to cases in which the differences of the two Vth flavors are particularly small and can or shall not be modified, e.g. for cost or technical reasons like leakage and speed performance optimization options.

It should further be noted that in case of very high N and/or $Y_C$, ECC (Error Correction Code) methods may be employed for ensembles of ICBC-X or RSX instances. For example, a simple ECC, correcting just one error, is typically sufficient in almost all relevant cases for ICBC-X ensembles of less than 256 bit.

On the other hand, parity checks for ICBC-X/RSX ensembles of, e.g. 32 or 64 bits, may be deployed at any rate as yield monitors.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A method for manufacturing a digital circuit comprising:
    forming two competing paths, wherein each of the competing paths comprises a plurality of field effect transistors, wherein the competing paths are formed such that a logic state of an output signal of the digital circuit in response to a predetermined input signal depends on the result of the competition of the two competing paths;
    connecting the field effect transistors such that the output signal of the digital circuit in response to the predetermined input signal has an undefined logic state when the threshold voltages of the field effect transistors are equal; and
    setting the threshold voltages of the field effect transistors such that the output signal of the digital circuit in response to the predetermined input signal has a predetermined defined logic state.

2. The method according to claim 1, comprising forming an output for a signal representing the logic state of the digital circuit.

3. The method according to claim 1, comprising forming a further circuit component and a connection for supplying the signal to the further circuit component.

4. The method according to claim 3, wherein the further circuit component is a logic gate.

5. The method according to claim 3, wherein the further circuit component is a flip-flop.

6. The method according to claim 1, wherein the two field effect transistors are both n channel field effect transistors or the two field effect transistors are both p channel field effect transistors.

7. The method according to claim 1, wherein the field effect transistors are MOSFETs.

8. The method according to claim 1, comprising forming the field effect transistors in CMOS technology.

9. The method according to claim 1, wherein the predetermined defined logic state is a logic 0 or a logic 1.

10. The method according to claim 1, wherein the digital circuit is a flip-flop.

11. The method according to claim 1, wherein the digital circuit is an RS-flip-flop.

12. The digital circuit of claim 1, wherein the field effect transistors substantially have the same dimensions.

\* \* \* \* \*